Dec. 30, 1969 W. J. TRAVIS 3,487,321

DIRECT COUPLED AMPLIFIER WITH NEGATIVE FEEDBACK

Filed July 14, 1965 2 Sheets-Sheet 1

INVENTOR

William J. Travis

BY Connolly and Hutz

ATTORNEYS

DIRECT COUPLED AMPLIFIER WITH NEGATIVE FEEDBACK

Filed July 14, 1965 2 Sheets-Sheet 2

INVENTOR
William J. Travis

BY Connolly and Hutz
ATTORNEYS

United States Patent Office 3,487,321

Patented Dec. 30, 1969

3,487,321

DIRECT COUPLED AMPLIFIER WITH NEGATIVE FEEDBACK

William J. Travis, North Adams, Mass., assignor to Sprague Electric Company, North Adams, Mass., a corporation of Massachusetts Filed July 14, 1965, Ser. No. 471,980
Int. Cl. H03f 3/68
U.S. Cl. 330—20 5 Claims

ABSTRACT OF THE DISCLOSURE

A wideband general purpose amplifier is provided which comprises five NPN transistor stages. The first and fourth are common emitter transistor stages; the second and third are emitter follower stages while the fifth is a base input, emitter follower stage. Negative feedback from the output of the fourth stage is capacitively coupled to a selective resistance combination in the base of the first stage and to the first stage impedance to provide gain control and bandshaping. A printed circuit embodiment provides for the interconnection of independently located functional elements of the amplifier through plug in connector terminals to form a variety of circuit configurations.

The present invention relates to all-transistor amplifiers such as those that can be used to change the amplitude of an electrical signal or change the impedance with which such a signal is supplied.

Among the objects of the present invention is the provision of novel amplifiers that have a high degree of versatility so that a single amplifier can, for example, be used to provide different functions.

Additional objects of the present invention include the provision of amplifiers that have very good stability with respect to temperature changes and the like.

The above as well as additional objects of the present invention will be more clearly understood from the following description of several of its exemplifications, reference being made to the accompanying drawings wherein.

According to the present invention a very desirable form of DC coupled all-transistor amplifier have five NPN high frequency transistors in successive series-connected one-transistor stages, the first and fourth being common emitter stages, the second and third emitter follower stages, and the fifth a base input stage. The second and third stages preferably have feedback resistors and the emitter impedance of the third stage can effectively be a series-connected component of the emitter impedance of the second stage. In addition, the first stage can have an emitter impedance and a base-to-signal-return resistance, the collector of the fourth stage being provided with a feedback connection to that emitter impedance and an AC feedback connection for a portion of the base-to-signal-return resistance.

It is also desirable in the foregoing amplifiers to have the emitter of the second stage connected through a resistor to the base of the third stage. This resistor is desirably capacitatively by-passed for high frequency signals.

According to another aspect of the present invention, a miniature all-transistor multipurpose printed circuit amplifier has a number of transistors permanently connected as a succession of stages, feedback links being separately connected along with a feedback modification link and input and output modification members, the stages of each of the links and members having terminal connectors for plug-in connection in external circuits that interconnect those connectors selected for use in such circuits. This type of printed circuit construction can be used for the previously described amplifiers and can have an RC circuit as a negative feedback link, a capacitive extension of said negative feedback link to act as another feedback link, and a limiter circuit as a feedback modification link.

Figure 1:
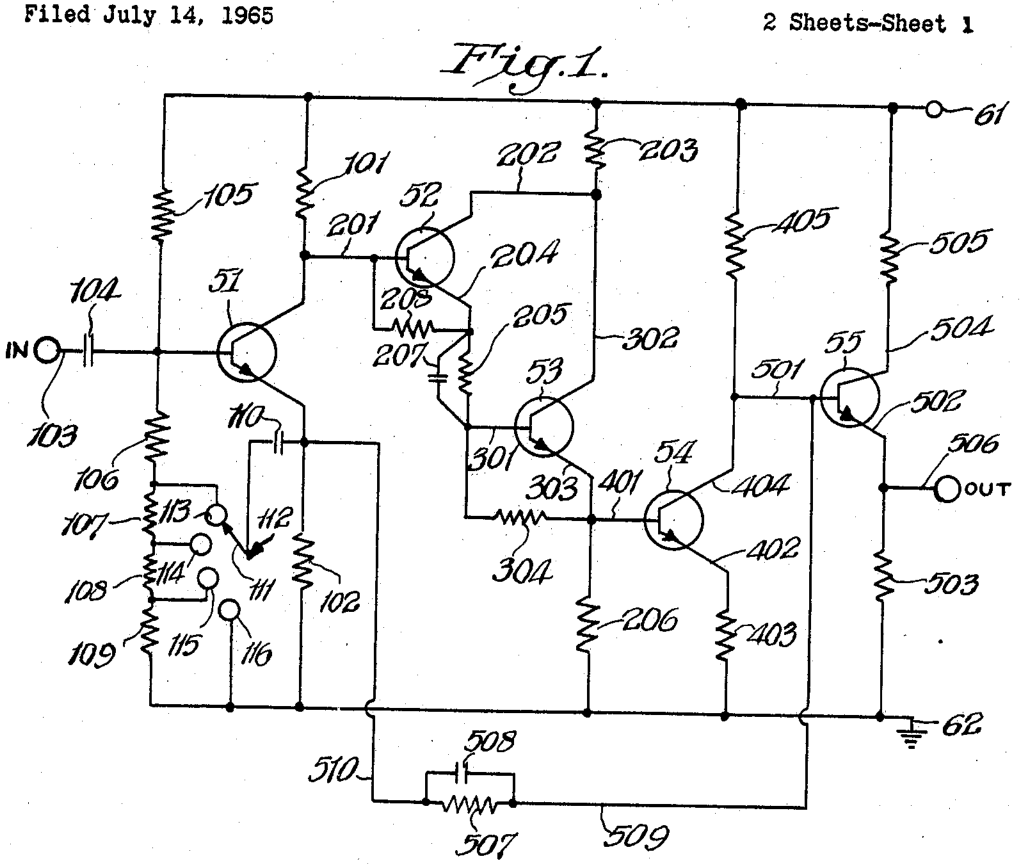
FIG. 1 is a circuit diagram of a typical amplifier pursuant to the present invention.

Turning now to the drawings, FIG. 1 illustrates a five-transistor amplifier in which the transistors are shown at 51, 52, 53, 54 and 55. Power to the transistors is supplied from terminals 61, 62 which can be connected to a battery or other suitable DC source, terminal 61 being the positive and terminal 62 the negative leads to the source. All the transistors are of the high frequency NPN type so that the amplifier can be used with signals having frequencies as high as 15 megacycles per second or even higher. Transistor 51 is connected as a common emitter amplification stage with a resistor 101 connecting its collector to positive lead 61 and a resistor 102 connecting its emitter to negative lead 62. Incoming signals are applied between the base of transistor 51 and negative lead 62 from an input terminal 103 connected to the transistor's base through a blocking capacitor 104. The base operating voltage is set by a voltage divider combination including resistor 105 connected between the base and positive lead 61 and chain of resistors 106, 107, 108, 109 connected between the base and neagtive lead 62. A coupling capacitor 110 is connected between the emitter of transistor 51 and the movable arm 111 of a selector switch 112, the switch having a number of terminals 113, 114, 115 and 116 connected to the negative side of the respective resistors 106, 107, 108 and 109.

Transistor 52 is connected as an emitter follower stage with its base directly linked by lead 201 to the collector of transistor 51. Lead 202 connects the collector of transistor 52 to the positive power supply lead 61 through a resistor 203. The emitter of transistor 52 is connected by lead 204 through a resistor 205 to the base of transistor 53, and the signal return is completed through a resistor 206 that returns the emitter of transistor 53 to the negative power supply lead 62. Resistor 205 can be by-passed as shown by capacitor 207 to improve the transmission of high frequency signals from transistor 52 to transistor 53. A positive feedback resistor 208 bridges across from emitter 204 to base lead 201.

Transistor 53 is also connected as an emitter follower with its base connected by lead 301 to the low end of resistor 205, its collector connected by lead 302 to the low end of resistor 203, and its emitter connected by lead 303 to the high end of resistor 206. As with transistor 52, transistor 53 also has a positive feedback resistor 304 connected between the emitter and base.

Transistor 54 is in a common emitter circuit, its base being connected by lead 401 to the high end of resistor 206, its emitter connected by lead 402 through resistor 403 to the negative power supply lead 62, and its collector connected by lead 404 through resistor 405 to the positive power supply lead 61.

Transistor 55 is illustrated as in an emitter follower circuit. Its base is connected by lead 501 to collector lead 404; its emitter connected by lead 502 through resistor 503 to the negative power supply lead 62; and its collector connected by lead 504 through resistor 505 to the positive power supply lead. An output terminal is shown at 506 as connected to emitter lead 502.

A negative feedback is established between the base of transistor 55 and the emitter of transistor 51. The feedback is shown as an RC network having a resistor 507 and a capacitor 508 connected in parallel between those two points by leads 509, 510.

A feature of the amplifier of FIG. 1 is that the negative feedback coupling through capacitor 110 to a portion of the base resistance combination of resistors 106 through 109 greatly increases the effective impedance of that base resistance. The input impedance of the amplifier will accordingly be determined essentially by resistor 105 and the input impedance of transistor 51. Resistor 105 can accordingly be reduced somewhat in value to provide a more effective voltage divider action for more closely controlling the operating voltage of the base of transistor 51. This is an important advantage in improving the stability of the amplifier, as the change in emitter operating voltage of transistor 51 over the temperature range becomes quite predictable because of the constant base voltage.

The preferred transistors for use with the present invention are of the silicon NPN type. The predictable change in base-to-emitter voltage of silicon transistors with respect to temperature changes makes it possible to greatly stabilize the output amplitude of the amplifier. Upon cooling down to −55° C., for example, the base-to-emitter voltages of the transistors will increase by 25 to 30%. This base-to-emitter voltage increase in transistor 52 causes resistor 208 to draw more current from the junction between resistor 101 and the collector of transistor 51. This has the effect of reducing the current through transistor 51 at such low temperatures. Because the base-to-emitter voltage of transistor 51 also increases and the base voltage of this transistor is held constant, as explained above, the emitter voltage of transistor 51 drops at the lower temperatures so that less current is passed through resistor 102. Without the additional current diversion of resistor 208 the voltage drop of the emitter of transistor 51 would require a sharp drop in the current through the feedback resistor 507 and would thus markedly change the voltage of the base of transistor 55. However, in accordance with the present invention the voltage change of that base can be greatly diminished and the emitter of transistor 55 can be held constant within a range less than 10% of the supply voltage.

The emitter follower stages 52, 53 connected as shown, provide both a high impedance and a high operating voltage for the collector of transistor 51. It will be noted, for example, that the operating voltage of that collector is equal to the sum of the base-to-emitter voltages of the second, third and fourth stages plus the voltage drop in resistor 205. The first stage accordingly operates very efficiently to provide considerable gain.

The signal loss by reason of the series resistor 205 is not significant because of the high incremental input impedance of the third stage. Capacitor 207 helps in this connection and also provides a phase lead that compensates for the reactive component of the input impedance of the third stage.

The fourth stage involving transistor 54 can have its emitter resistor 403 unby-passed so as to provide degeneration to further stabilize the operation of the amplifier and also to limit its maximum gain if desired. It can also be by-passed as by a capacitance to limit the degeneration.

The fifth stage is shown as operated conventionally with resistors both in its collector and emitter returns to safeguard against inadvertent shorting of the output and to enable the takeoff of signals from either the emitter or the collector, as desired.

The negative feedback network 507, 508 is sufficiently heavy to effectively control the gain as well as band width of the amplifier. To this end it is convenient, as illustrated in FIG. 1, to run that feedback network as a fixed return to the emitter of the first stage and merely selectively apply that feedback to the base return resistance of that stage as by the switch 112. The higher up in the base resistance that feedback is returned, the greater overall drop in amplification and the greater the band width. By changing the capacitance of that feedback network the frequency response is also changed and limiters can be added to the feedback network, if desired, to reduce the feedback on very low or very high signal levels, or both.

Figure 5:
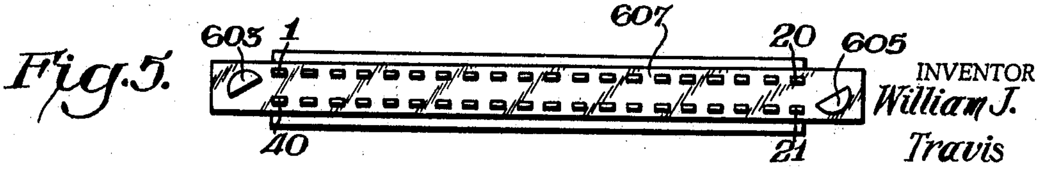

In addition to varying the gain and band width in the foregoing manner, the amplifier of FIG. 1 can be made sharply frequency-selective as by making the negative feedback network 507, 508 of the notch filter type. An RC distributed network such as shown in connection with FIG. 5 of the Sprague Electric Company Technical Paper TP–64–1 "A General-Purpose Ceramic-Base Thin-Film Microcircuit Amplifier" by Manfred Kahn, copyrighted 1964, or as shown in U.S. patent application Ser. No. 171,495 filed Feb. 6, 1962. The amplifier can also be used for pulse non-linear amplification.

The foregoing constructions are particularly desirable for miniature printed circuit constructions inasmuch as all the components lend themselves to this type of fabrication.

FIGS. 2 through 5 show one printed-circuit amplifier which is arranged to be used without modification for any of the amplification purposes discussed above. This construction has a sheet metal base 601 to adjacent corners of which is welded a pair of plug-in pins 603, 605. These pins can have non-circular cross-sections so as to be keyed to the sockets into which they are to be plugged. Extending from one pair to the other is an enlarged supporting bar 607 of plastic composition.

Against each face of the metal base is a thin dielectric sheet 610, 611 preferably low dielectric constant ceramic like $Al_2O_3$, and all the circuit components and connections are mounted on or connected to these sheets. Bar 607 also carries a set of prongs shown as a total of 40 in two rows of 20 each, numbered 1 through 40. The various connections sites of the amplifier run to these prongs. Where there are more prongs than needed for this purpose, some, such as 10 and 14, may be unconnected or even omitted.

The dielectric sheets can have their components and connections applied by any desired printed circuit technique. All resistors and connectors can be formed as described in Sprague Electric Company Technical Paper TP–60–3 "Ceramic Based Microcircuits—A Heterogeneous Approach to Miniaturization" by Manfred Kahn, copyright 1960, and the remaining components subsequently connected as by soldering. Some of the capacitances in the final circuit are small enough to be merely applied by edge-effect between two closely spaced connector coatings on the dielectric sheets, as shown at 612 in FIG. 3 and 613 in FIG. 2. Larger capacitances can be of the ceramic multilayer type described in Sprague Electric Company Technical Paper TP–58–6 "Monolythic Structure—A new Concept for Ceramic Capacitors" by J. Fabricius, copyright 1958, and illustrated at 614, 615 as soldered in place to connector sites without leads. Still larger capacitances can be provided as by soldering in the leads of wound or porous pellet capacitors, as indicated at 616 and 617. The last-mentioned capacitors are generally provided in tubular containers of appreciable thickness so that it may be desirable to cut a window in the ceramic sheet as well as in the metal sheet to reduce the overall thickness of the amplifier.

Transistors are shown at 621, 622, 623, 624 and 625, and they are also conveniently soldered in place by their leads. Where leads cross over each other or over connector coatings, the leads should be insulated as by sleeves or the coatings covered as by dielectric top layers or strips. Such strips can also be placed under the transistors, as illustrated at 627.

Diodes are illustrated at 630 and 631.

The dielectric sheets with all their contents can also be potted or imbedded in a plastic molded or cast about the entire assembly, as indicated at 629. An epoxy resin is suitable for this purpose.

Figure 6:
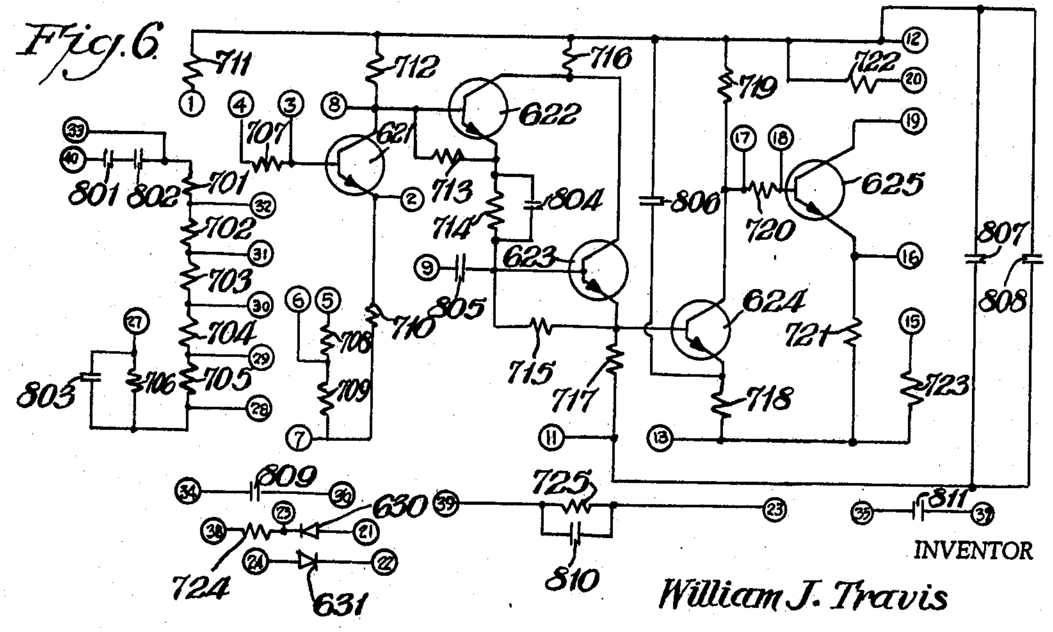
FIG. 6 is a circuit diagram of the amplifier illustrated in FIGS. 2 through 5.
Figures 2, 3, 4:
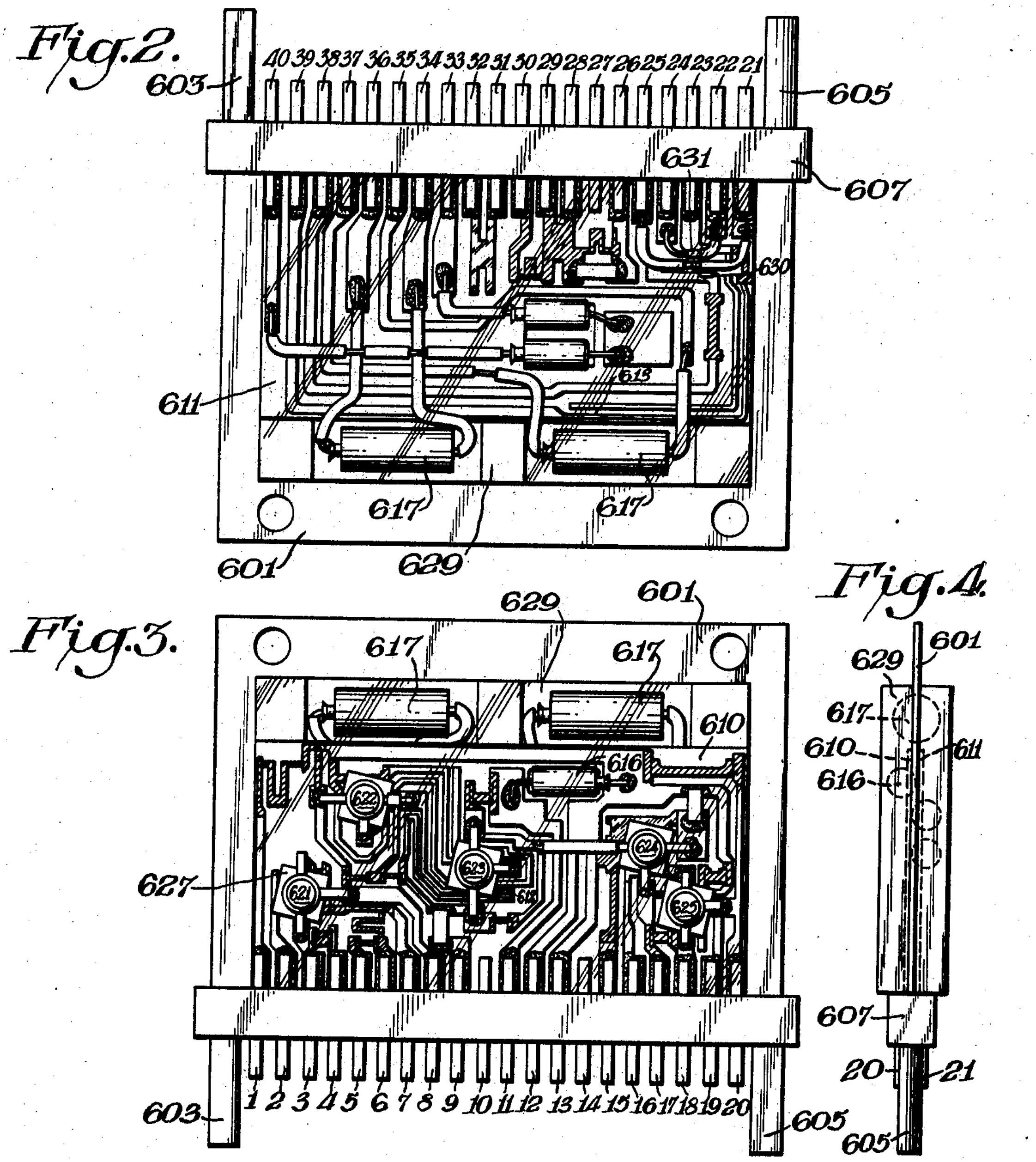
FIG. 2 is a top view of a physical embodiment of an amplifier representative of the present invention.
FIG. 3 is a bottom view of the amplifier of FIG. 2.
FIGS. 4 and 5 are side and front views of the amplifier of FIGS. 2 and 3.

The amplifier of FIGS. 2 through 5 has its circuit diagram illustrated in FIG. 6, where the numbers identify the prongs to which the various connections are made. This construction is connected as:

(a) An 80 db amplifier of 300 kc, bandwidth by connecting together the following prongs: 1 to 3, 4, and 33; 2 to 36, 37, and 39; 7 to 11, 13, 28, 34 and 35; 19 to 20; 23 to 17 and 18.

(b) A 60 db amplifier of 2 mc. bandwidth by connecting 1 to 3, 4 and 33; 2 to 36, 37, and 39; 29 to 34 and 35; 7 to 11, 13, and 28; 19 to 20; 23 to 17 and 18; 15 to 16.

(c) A 40 db amplifier of 20 mc. bandwidth by connecting 1 to 3, 4, and 33; 2 to 36, 37, and 39; 30 to 34 and 35; 7 to 11, 13, and 28; 19 to 20, 23 to 17 and 18.

(d) A phase splitter of 40 db gain by connecting 1 to 3, 4, and 33; 31 to 32; 2 to 36, 37, and 39; 29 to 34 and 35; 7 to 11, 23, and 28; 19 to 20; 23 to 17 and 18; 15 to 16.

(e) An audio limiter having a maximum gain of 40 db by connecting 1 to 3, 4, and 33; 2 to 35, 36, and 39; 37 to 38; 21 to 17, 18, 22, and 23; 24 to 25; 7 to 11, 13, 28, and 9; 19 to 20.

(f) A limiting pulse amplifier of 20 db gain by connecting 1 to 4, 27, and 33; 2 to 39; 8 to 9; 23 to 17; 7 to 11 and 13; 19 to 20.

Typical values for the circuit elements that enable such uses are:

| | | |
|---|---|---|
| Resistors: | | |
| **701** | ohms | 8.5K |
| **702** | do | 1.2K |
| **703** | do | 150 |
| **704** | do | 100 |
| **705** | do | 8.9 |
| **706** | do | 36.6K |
| **707** | do | 5.1K |
| **708** | do | 1.5K |
| **709** | do | 180 |
| **710** | do | 1K |
| **711** | do | 74.2K |
| **712** | do | 15K |
| **713** | do | 2K |
| **714** | do | 1K |
| **715** | do | 1K |
| **716** | do | 100 |
| **717** | do | 470 |
| **718** | do | 6 |
| **719** | do | 1K |
| **720** | do | 430 |
| **721** | do | 4.7K |
| **722** | do | 100 |
| **723** | do | 102 |
| **724** | do | 100 |
| **725** | do | 10K |
| Capacitors: | | |
| **801** | microfarads | 4.7 |
| **802** | do | 4.7 |
| **803** | picofarads | 342 |
| **804** | do | 2.2 |
| **805** | microfarad | .002 |
| **806** | do | .002 |
| **807** | do | .01 |
| **808** | do | 2.2 |
| **809** | do | 56 |
| **810** | picofarad | 1 |
| **811** | microfarads | 56 |
| Transistors: | | |
| **621** | Type | 2N2369 |
| **622** | Type | 2N2369 |
| **623** | Type | 2N2369 |
| **624** | Type | 2N2369 |
| **625** | Type | 2N2369 |
| Diode **630** | Type | 1N914 |
| Diode **631** | Type | 1N914 |

Obviously many modifications and variations of the present invention are possible in the light of the above teachings. It is, therefore, to be understood that within the scope of the appended claims the invention may be practiced otherwise than as specifically described.

What is claimed is:

1. A DC coupled all-transistor amplifier having five NPN high frequency transistors in cascade stages, the first and fourth being cammon emitter stages, the second and third emitter follower stages and the fifth a base input stage, and wherein the second transistor stage includes an emitter-to-base feedback resistor and an emitter impedance, the third stage includes an emitter-to-base feedback resistor and an emitter impedance and in which the third stage emitter impedance is connected in series with the emitter impedance of the second stage through the emitter-base feedback resistor of the third stage.

2. The combination of claim 1 in which the first transistor stage includes an emitter impedance, a plurality of resistors connected in series with the base of the first transistor stage, a coupling capacitor connected between said series resistors and said emitter impedance and means for completing a circuit from said coupling capacitor to one, or a combination, of said series resistors and in which the collector of the fourth stage has a feedback connection to the emitter impedance and the coupling capacitor of said first stage.

3. The combination of claim 1 in which the emitter of the second transistor stage is connected to the base of the third transistor stage through a resistor.

4. The combination of claim 3 in which the resistor is capacitively by-passed for high frequency signals.

5. The combination of claim 1 wherein the components comprising said amplifier are attached to at least one thin dielectric sheet and in the following manner: the five transistor stages including all emitter resistors and the emitter-to-base resistors of stage two and three are interconnected to form one functional portion of the total circuit; all other functional elements including said coupling capacitor, feedback connection from fourth to first stage and first transistor stage series base resistors are mounted, physically separate from each other and from the functionally interconnected transistor stages, said stages and each of said functional elements having terminal connectors for plug-in connection in external circuits that interconnect those connectors selected for use in a desired circuit.

References Cited

UNITED STATES PATENTS

| | | | |
|---|---|---|---|
| 3,369,186 | 2/1968 | Lejon | 330—20 |
| 3,075,151 | 1/1963 | Murray | 330—28 X |
| 3,096,487 | 7/1963 | Lee | 330—26 X |
| 3,303,380 | 2/1967 | Kozikowski | 330—28 X |

FOREIGN PATENTS

| | | |
|---|---|---|
| 1,084,333 | 6/1960 | Germany. |

ROY LAKE, Primary Examiner

LAWRENCE J. DAHL, Assistant Examiner

U.S. Cl. X.R.

330—19, 28

CERTIFICATE OF CORRECTION

Patent No. 3,487,321 Dated December 30, 1969

Inventor(s) William J. Travis

It is certified that error appears in the above-identified patent and that said Letters Patent are hereby corrected as shown below:

Column 5, line 5, change "circut" to -- circuit --
Column 5, line 22, change "23" (first occurrence) to -- 13 --
Column 6, line 15, change "cammon" to -- common --

SIGNED AND
SEALED
JUN 9 1970

(SEAL)
Attest:

Edward M. Fletcher, Jr.
Attesting Officer

WILLIAM E. SCHUYLER, JR.
Commissioner of Patents